(12) United States Patent
Ogawa

(10) Patent No.: US 8,982,632 B2
(45) Date of Patent: Mar. 17, 2015

(54) SEMICONDUCTOR MEMORY DEVICE AND METHOD OF DRIVING SEMICONDUCTOR MEMORY DEVICE

(71) Applicant: Fujitsu Semiconductor Limited, Yokohama-shi, Kanagawa (JP)

(72) Inventor: Hiroyuki Ogawa, Nagoya (JP)

(73) Assignee: Fujitsu Semiconductor Limited, Yokohama (JP)

(*) Notice: Subject to any disclaimer, the term of this patent is extended or adjusted under 35 U.S.C. 154(b) by 89 days.

(21) Appl. No.: 13/777,529

(22) Filed: Feb. 26, 2013

(65) Prior Publication Data

US 2013/0301363 A1 Nov. 14, 2013

(30) Foreign Application Priority Data

May 9, 2012 (JP) ................................ 2012-107330

(51) Int. Cl.
| G11C 11/34 | (2006.01) |
| G11C 16/04 | (2006.01) |
| G11C 16/10 | (2006.01) |
| G11C 16/34 | (2006.01) |

(52) U.S. Cl.
CPC ........ G11C 16/0408 (2013.01); G11C 16/0483 (2013.01); G11C 16/10 (2013.01); G11C 16/3418 (2013.01)
USPC ............ 365/185.18; 365/185.02; 365/185.05; 365/185.11

(58) Field of Classification Search
CPC ............... G11C 16/04; G11C 16/0408; G11C 16/0483; G11C 16/10; G11C 16/3418

USPC ........................... 365/185.06, 185.28, 185.29
See application file for complete search history.

(56) References Cited

U.S. PATENT DOCUMENTS

| 5,801,994 | A | * | 9/1998 | Chang et al. ............. 365/185.29 |
| 5,909,392 | A | * | 6/1999 | Chang et al. ............. 365/185.12 |
| 6,091,632 | A | * | 7/2000 | Yoshimi et al. ........... 365/185.11 |
| 6,172,397 | B1 | * | 1/2001 | Oonakado et al. ............. 257/321 |
| 6,243,292 | B1 | | 6/2001 | Kobayashi et al. |
| 6,801,456 | B1 | * | 10/2004 | Hsu et al. ................. 365/185.18 |
| 2002/0014641 | A1 | * | 2/2002 | Shukuri et al. ................ 257/275 |
| 2005/0041468 | A1 | * | 2/2005 | Mihnea et al. ........... 365/185.02 |

(Continued)

FOREIGN PATENT DOCUMENTS

| JP | 11-003595 A | 1/1999 |
| JP | 11-177069 A | 7/1999 |

(Continued)

OTHER PUBLICATIONS

Korean Office Action dated Jul. 30, 2014, issued in Korean Patent Application No. 10-2013-31641, w/English translation (6 pages).

*Primary Examiner* — Viet Q Nguyen
(74) *Attorney, Agent, or Firm* — Westerman, Hattori, Daniels & Adrian, LLP

(57) ABSTRACT

Upon programming a semiconductor memory device including a first and a second n-wells, a first and a second p-channel memory transistors respectively formed in the first and the second n-wells, and a bit line connected to a drain of the first p-channel transistor and a drain of the second p-channel memory transistor, a first voltage is applied to the first bit line, a second voltage is applied to the first n-well, and a third voltage lower than the second voltage is applied to the second n-well.

15 Claims, 19 Drawing Sheets

(56) References Cited

U.S. PATENT DOCUMENTS

| | | |
|---|---|---|
| 2005/0052918 A1 | 3/2005 | Dormans et al. |
| 2005/0083783 A1* | 4/2005 | Baskerville et al. .............. 367/1 |
| 2005/0179095 A1* | 8/2005 | Hsu et al. ....................... 257/390 |
| 2005/0253198 A1 | 11/2005 | Lee |
| 2006/0033146 A1* | 2/2006 | Wang ............................ 257/315 |
| 2007/0057314 A1 | 3/2007 | Natori et al. |
| 2007/0230251 A1 | 10/2007 | Ajika et al. |
| 2007/0253257 A1* | 11/2007 | Wang ....................... 365/185.29 |
| 2008/0273387 A1* | 11/2008 | Ajika et al. .............. 365/185.15 |
| 2009/0147583 A1 | 6/2009 | Kim |
| 2009/0161439 A1 | 6/2009 | Aiika et al. |
| 2011/0205810 A1 | 8/2011 | Kasai et al. |
| 2012/0320681 A1* | 12/2012 | Mirabel .................. 365/185.18 |

FOREIGN PATENT DOCUMENTS

| | | |
|---|---|---|
| JP | 2001-210808 A | 8/2001 |
| JP | 2005-510889 A | 4/2005 |
| JP | 2005-328023 A | 11/2005 |
| JP | 2006-128594 A | 5/2006 |
| JP | 2007-073894 A | 3/2007 |
| JP | 3962769 B2 | 8/2007 |
| JP | 4113559 B2 | 7/2008 |
| JP | 2009-147304 A | 7/2009 |
| JP | 2009-212292 A | 9/2009 |
| JP | 4522879 B2 | 8/2010 |
| JP | 2011-171582 A | 9/2011 |

\* cited by examiner

SEMICONDUCTOR MEMORY DEVICE AND METHOD OF DRIVING SEMICONDUCTOR MEMORY DEVICE

CROSS-REFERENCE TO RELATED APPLICATION

This application is based upon and claims the benefit of priority of the prior Japanese Patent Application No. 2012-107330, filed on May 9, 2012, the entire contents of which are incorporated herein by reference.

FIELD

The embodiments discussed herein are related to a semiconductor memory device including a p-channel memory transistor and a method of driving the semiconductor memory device.

BACKGROUND

Recently, nonvolatile semiconductor memory devices represented by flash memories are prevalently used as data memory element of various electronic devices. As one of the important characteristics required of the nonvolatile semiconductor memory devices is the data retention characteristics. To improve the data retention characteristics, it is important that the constitutions of the devices are improved, and also the disturb stress in operations is mitigated to suppress the breakage of the stored data.

The followings are examples of related: Japanese Patent No. 3962769; Japanese Patent No. 4113559; Japanese Patent No. 4522879; Japanese Laid-open Patent Publication No. 11-003595; Japanese Laid-open Patent Publication No. 11-177069; Japanese Laid-open Patent Publication No. 2001-210808; Japanese Laid-open Patent Publication No. 2005-328023; Japanese Laid-open Patent Publication No. 2005-510889; Japanese Laid-open Patent Publication No. 2007-073894; Japanese Laid-open Patent Publication No. 2009-147304; Japanese Laid-open Patent Publication No. 2009-212292; and Japanese Laid-open Patent Publication No. 2011-171582.

Thus, the semiconductor memory devices of higher performance, which have the reliability improved by mitigating the disturb stress in operations are required.

SUMMARY

According to one aspect of the embodiments, there is provided a semiconductor memory device including a first n-well formed in a semiconductor substrate, a second n-well formed in the semiconductor substrate and electrically isolated from the first n-well, a first p-channel memory transistor formed in the first n-well, a second p-channel memory transistor formed in the second n-well, a first word line connected to a control gate of the first p-channel memory transistor, a second word line connected to a control gate of the second p-channel memory transistor, a first bit line connected to a drain of the first p-channel transistor and a drain of the second p-channel memory transistor, and a control circuit which, upon programming in the first p-channel memory transistor, applies a first voltage to the first bit line, a second voltage to the first n-well and a third voltage lower than the second voltage to the second n-well.

According to another aspect of the embodiments, there is provided a method of driving a semiconductor memory device including a first n-well formed in a semiconductor substrate, a second n-well formed in the semiconductor substrate and electrically isolated from the first n-well, a first p-channel memory transistor formed in the first n-well, a second p-channel memory transistor formed in the second n-well, a first word line connected to a control gate of the first p-channel memory transistor, a second word line connected to a control gate of the second p-channel memory transistor, and a first bit line connected to a drain of the first p-channel transistor and a drain of the second p-channel memory transistor, including upon programming the first p-channel memory transistor, a first voltage being applied to the first bit line, a second voltage being applied to the first n-well, and a third voltage lower than the second voltage being applied to the second n-well.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A semiconductor memory device and method of driving the semiconductor device according to an embodiment will be described with reference to FIGS. 1 to 19C.

Figure 1:
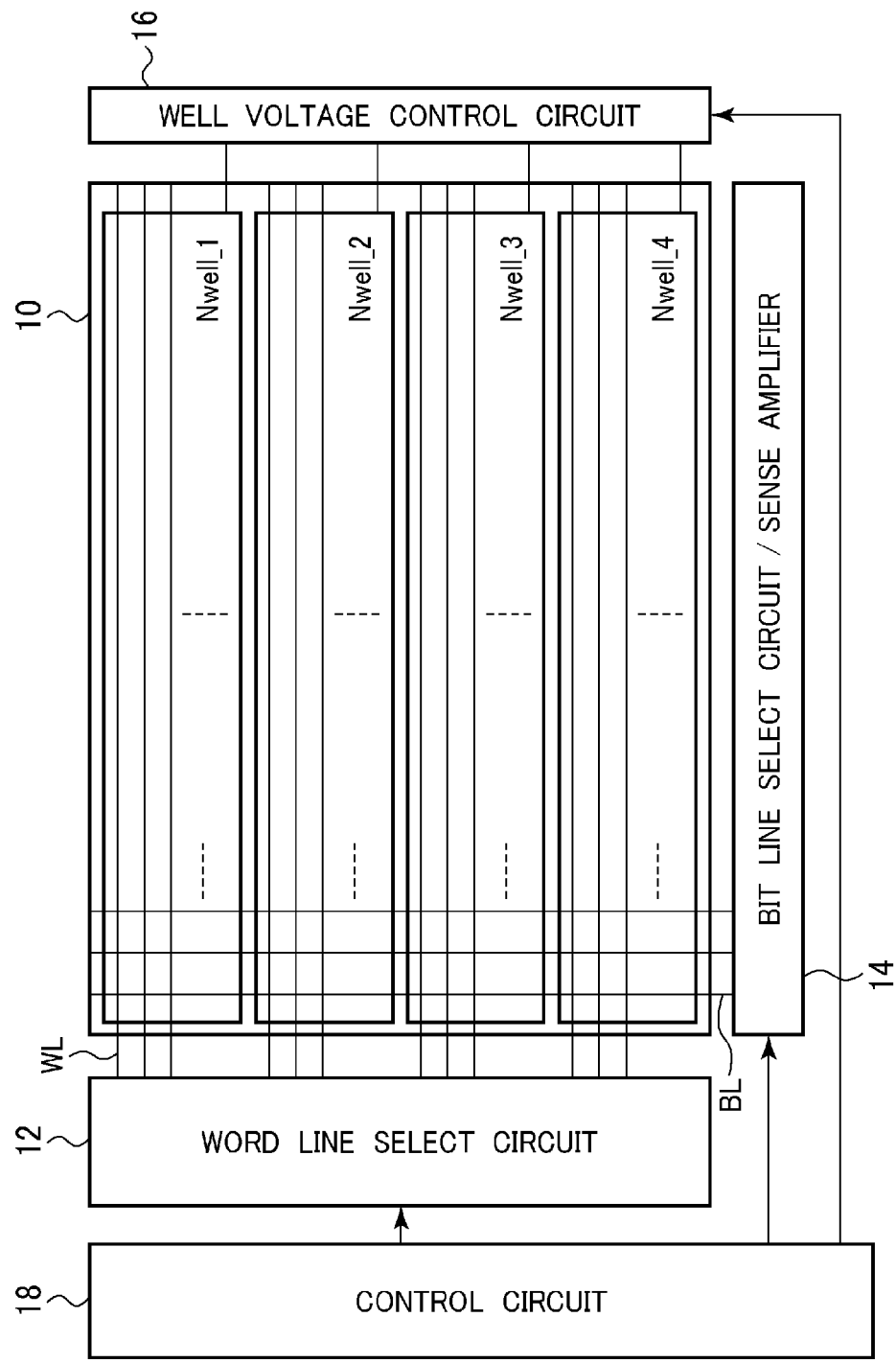
FIGS. 1, 2 and 3 are circuit diagrams illustrating a structure of a semiconductor memory device according to an embodiment.
Figure 2:
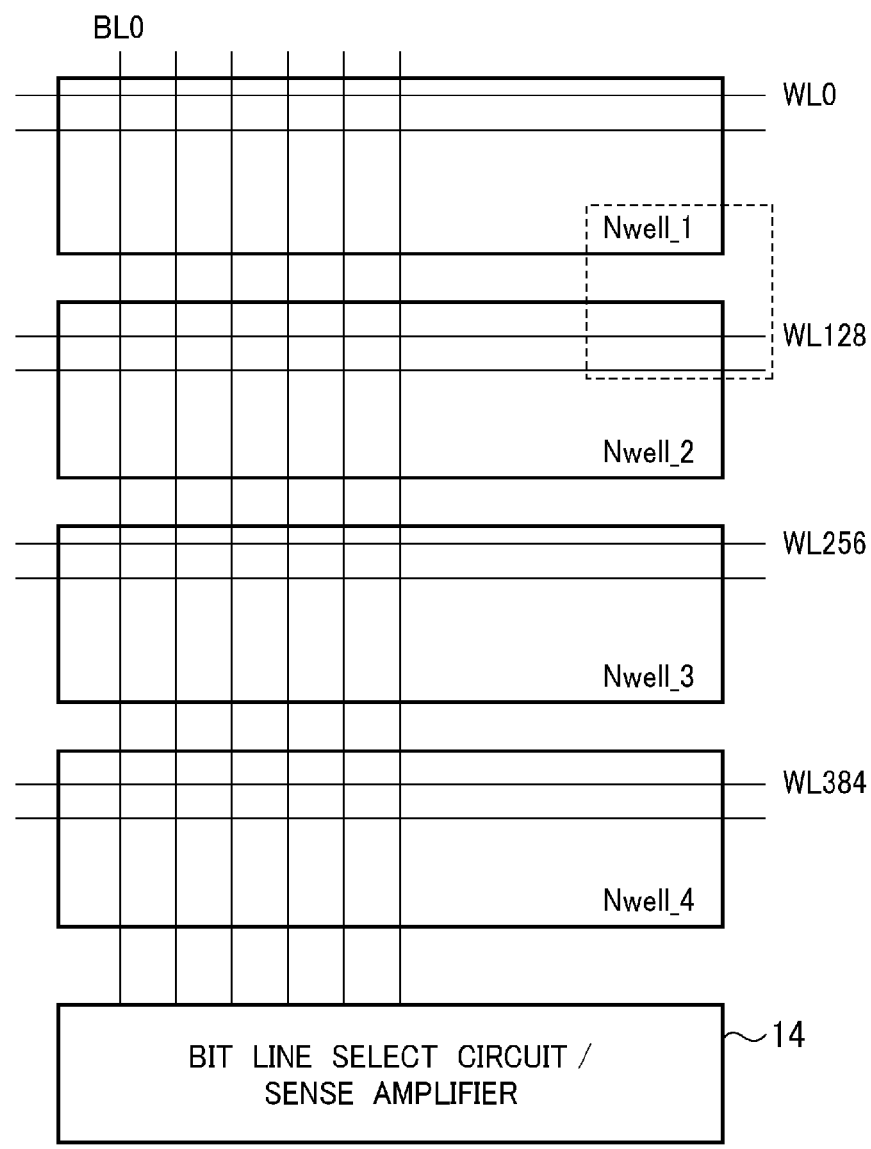
Figure 3:
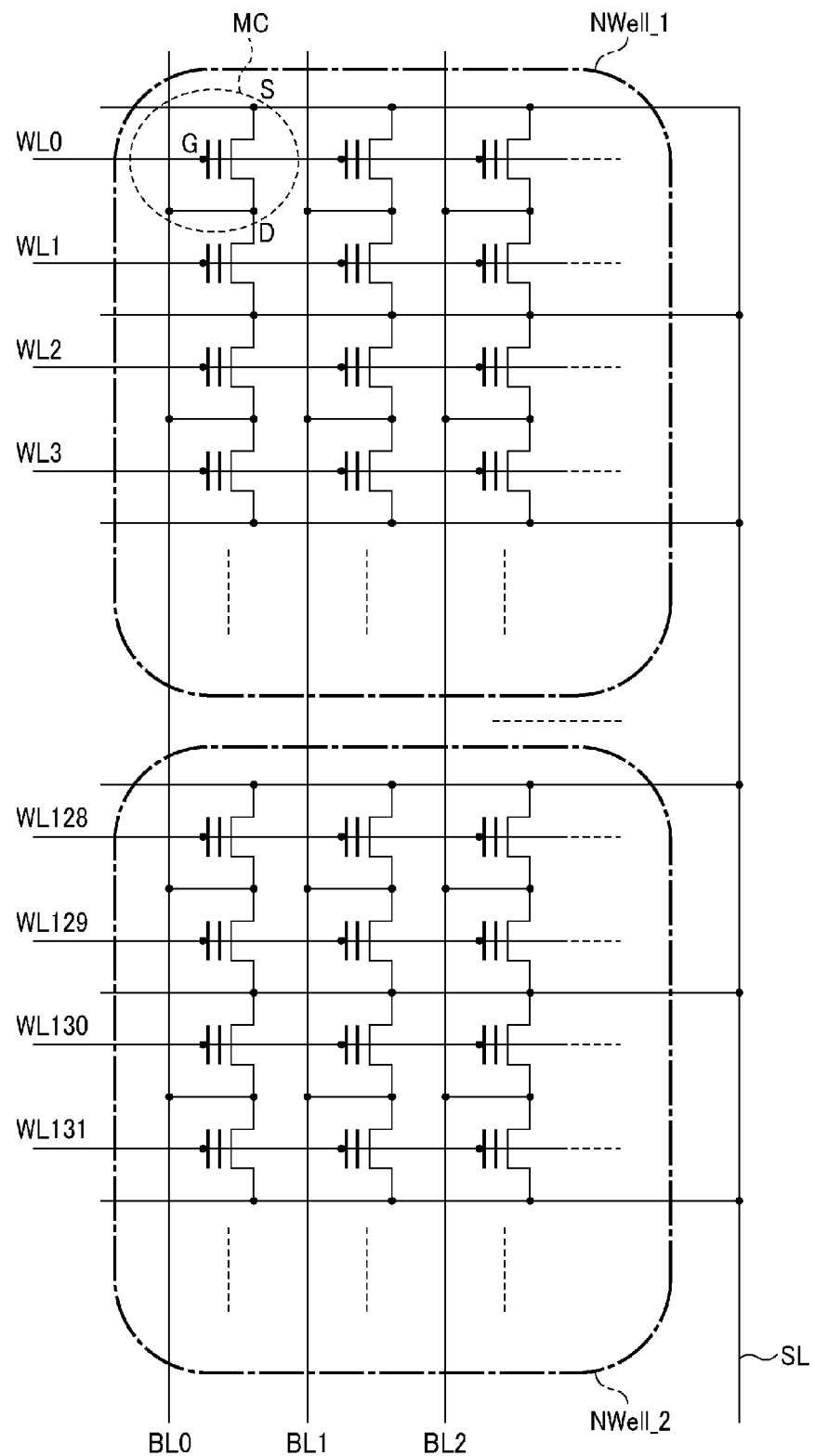
Figure 4:
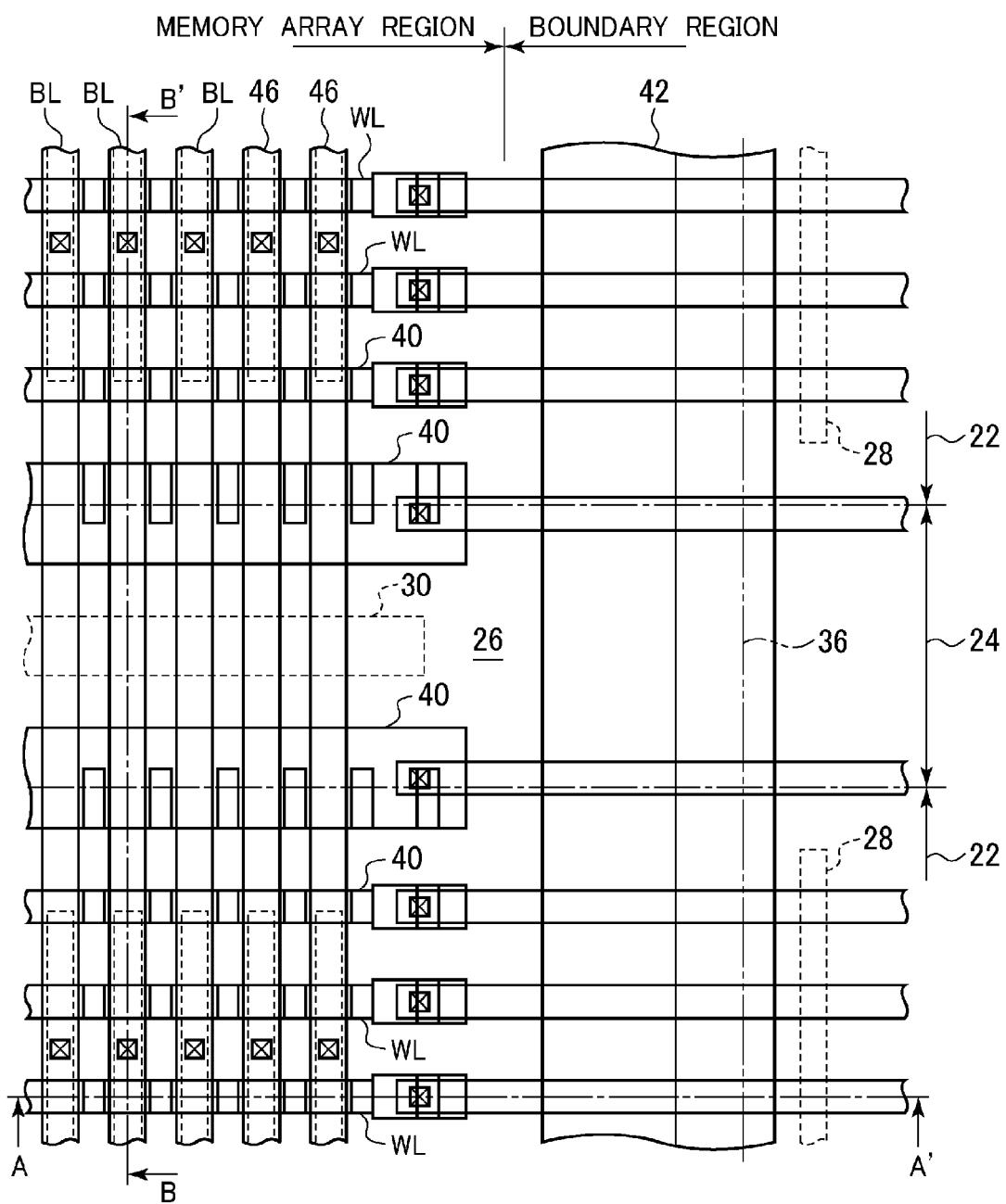
FIG. 4 is a plan view illustrating the structure of the semiconductor memory device according to the embodiment.
Figure 5:
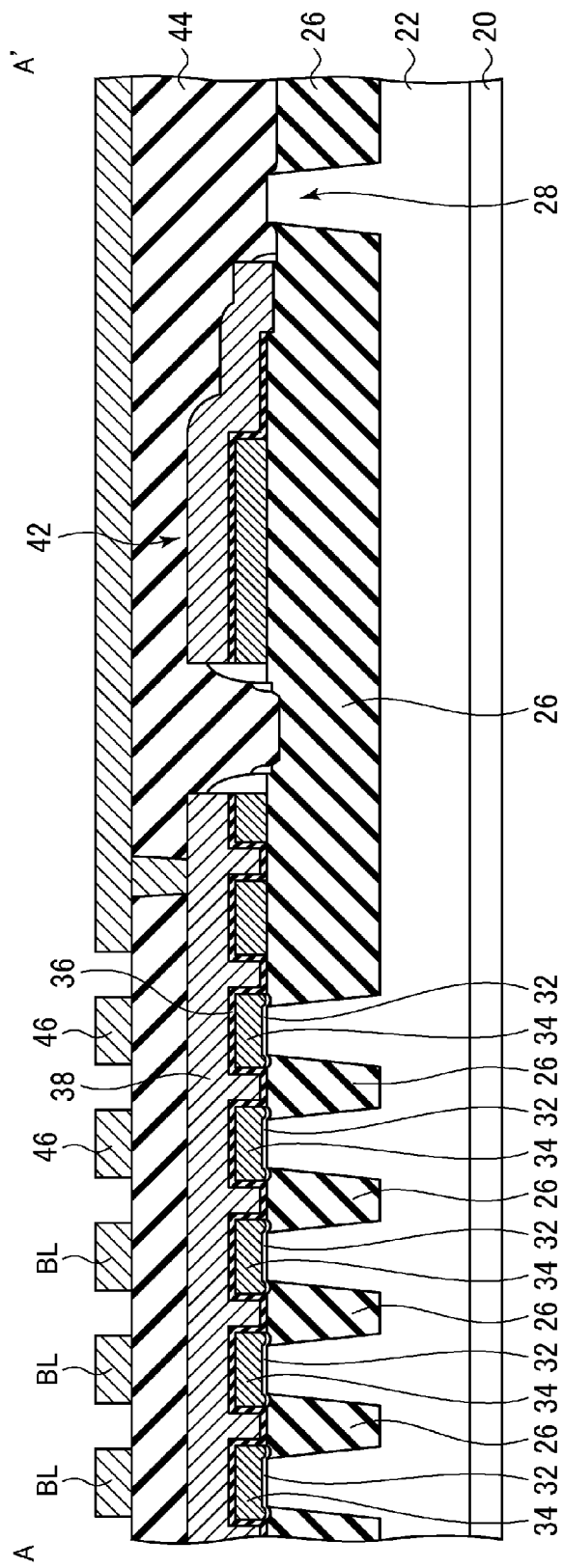
FIGS. 5 and 6 are diagrammatic cross-sectional views illustrating the structure of the semiconductor memory device according to the embodiment.
Figure 6:
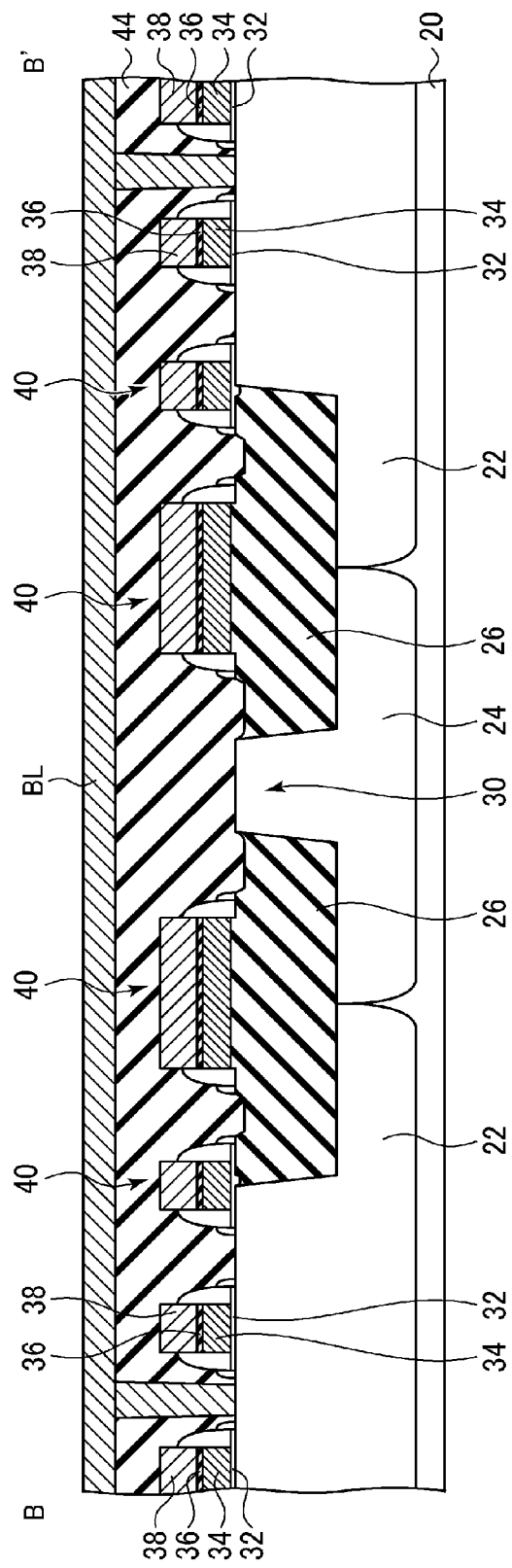
Figure 7:
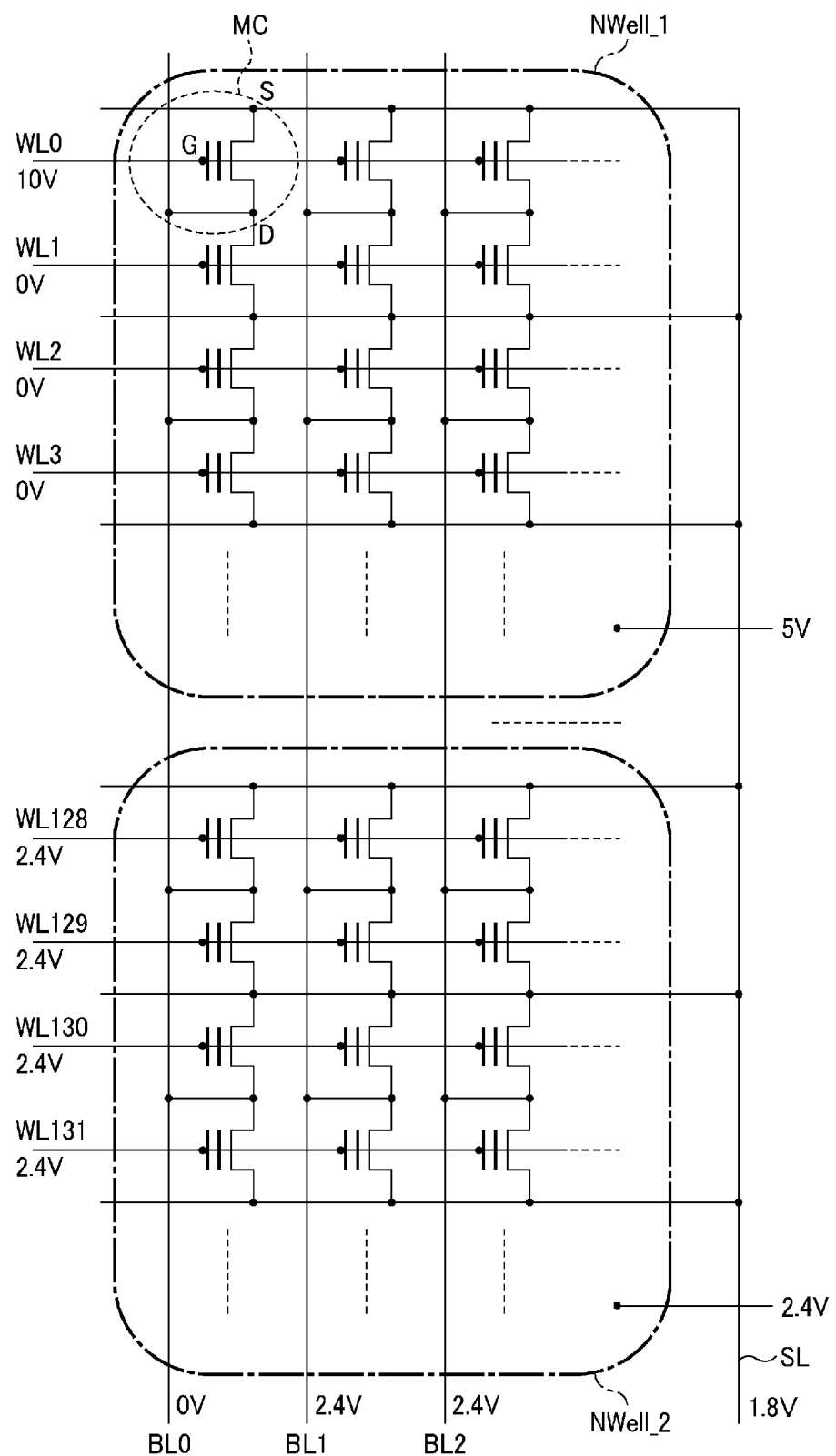
FIG. 7 is a circuit diagram illustrating a method of programming the semiconductor memory device according to the embodiment.
Figure 8A:
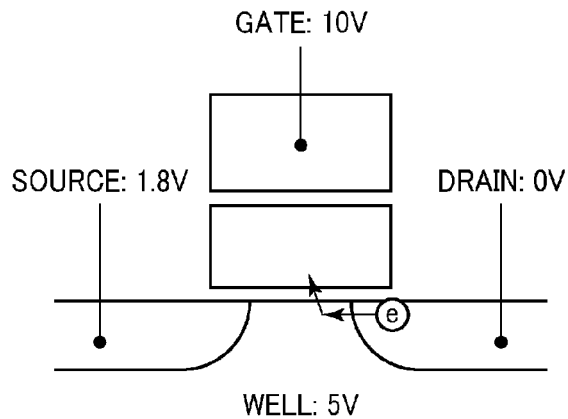
FIGS. 8A, 8B and 8C are views illustrating voltages to be applied to a memory transistor in the method of programming the semiconductor memory device according to the embodiment.
Figure 8B:
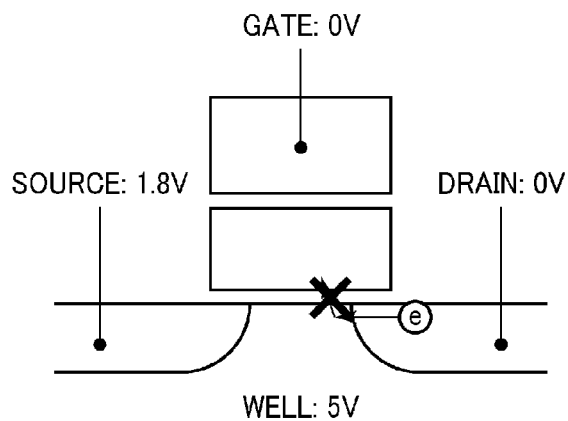
Figure 8C:
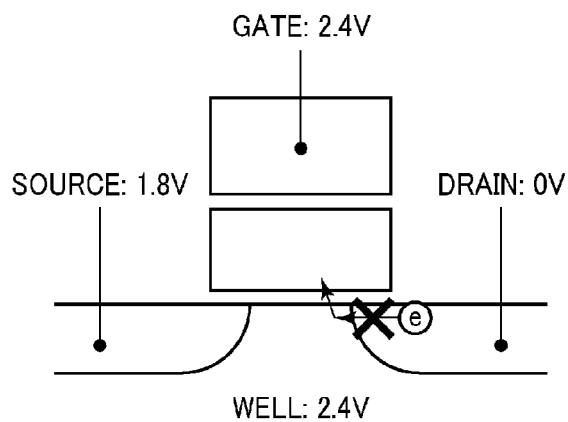
Figure 9:
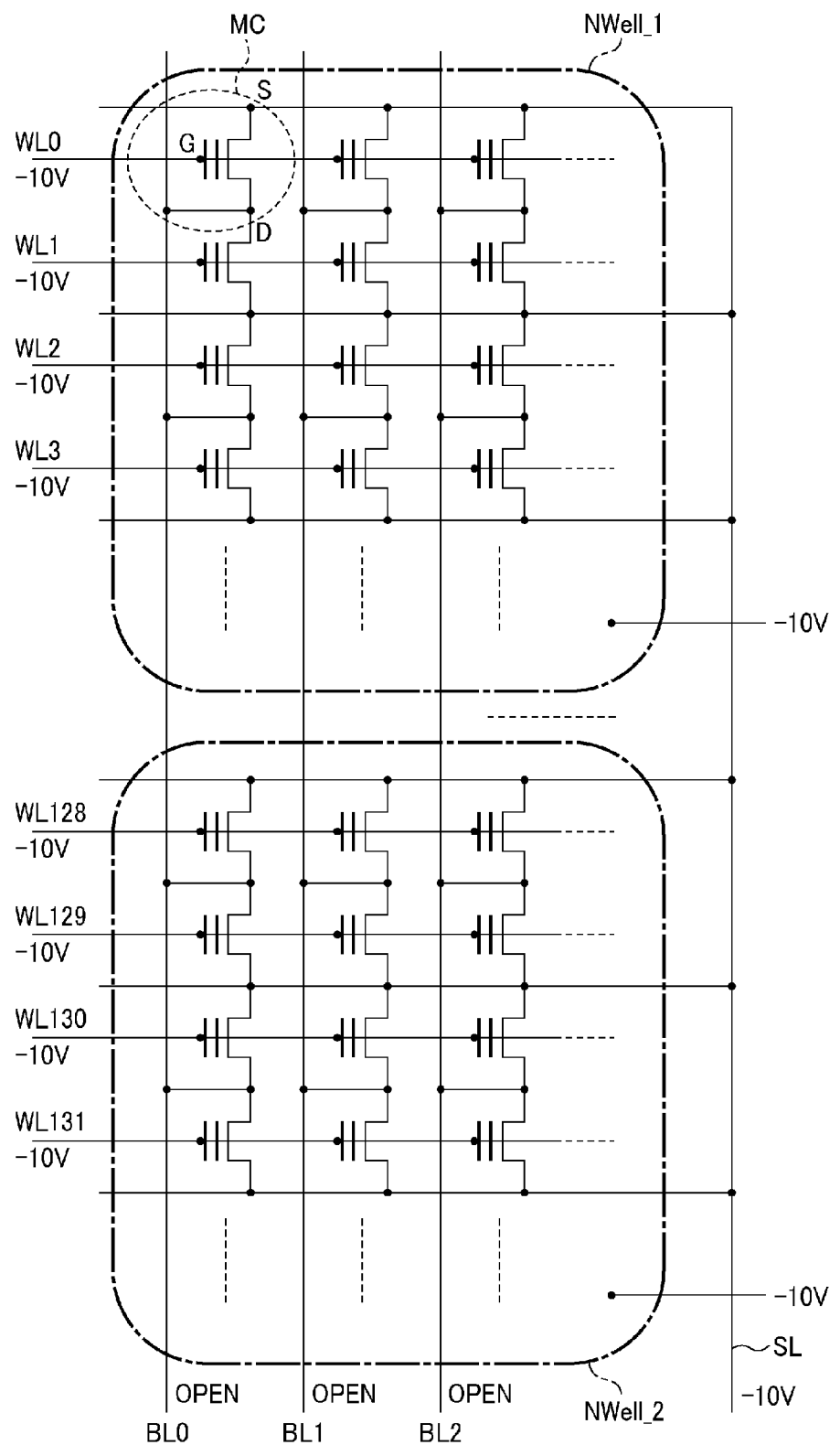
FIGS. 9 and 10 are circuit diagrams illustrating a method of erasing the semiconductor memory device according to the embodiment.
Figure 10:
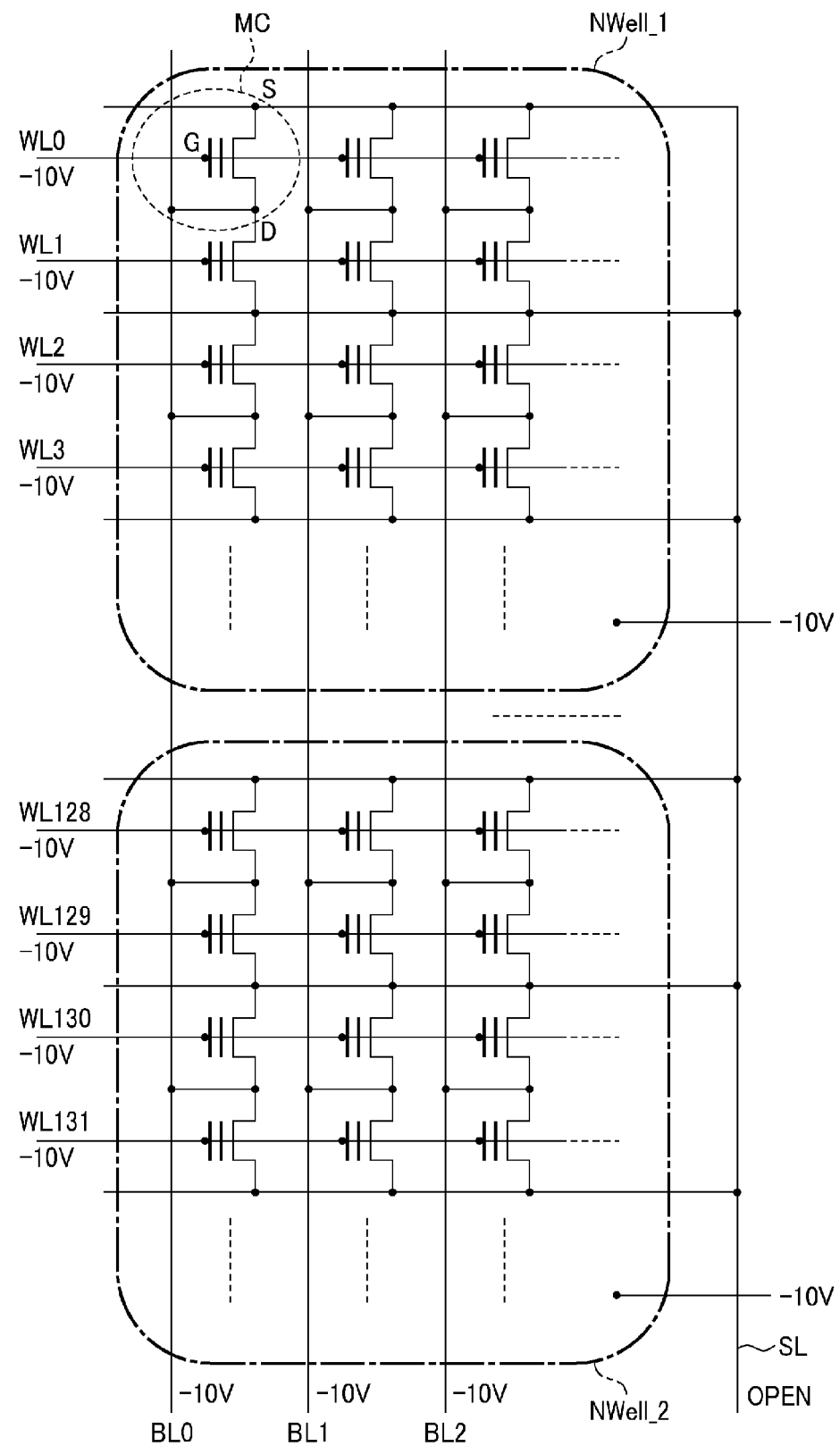
Figure 11:
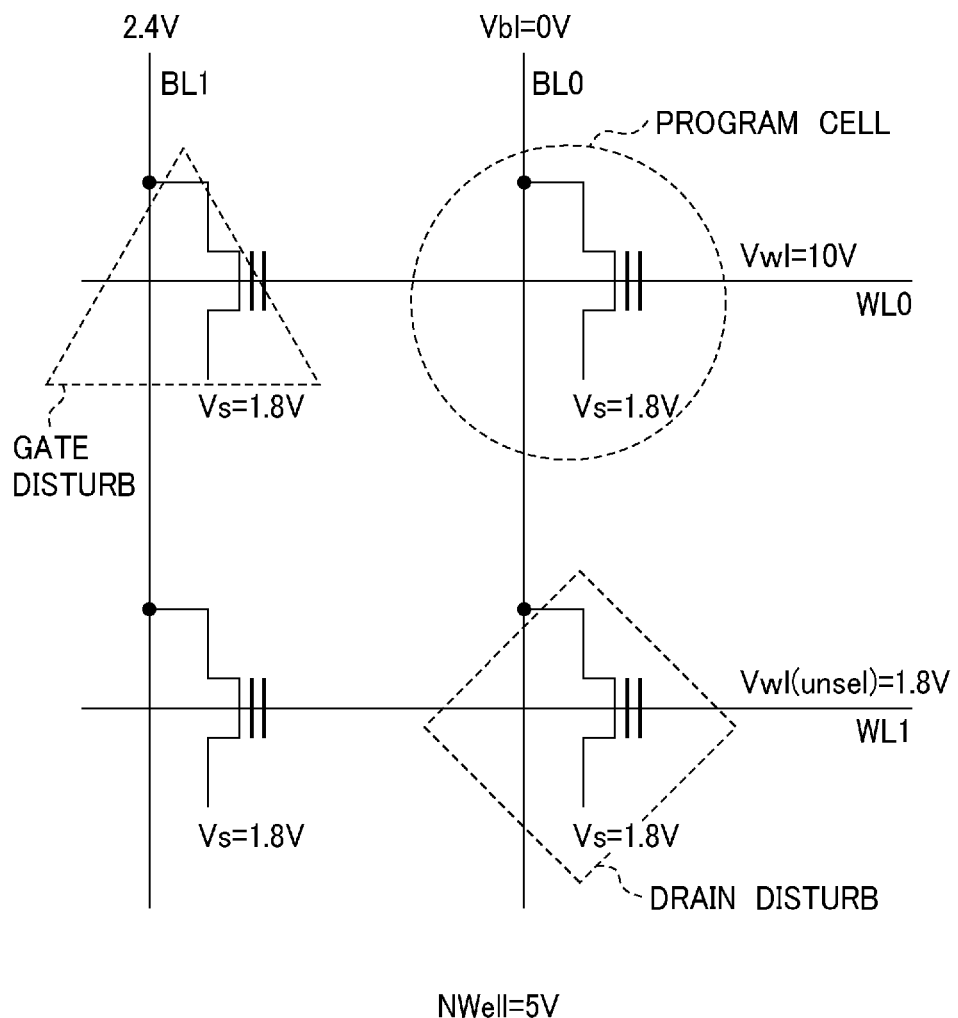
FIG. 11 is a circuit diagram explaining the drain disturb of the unselected memory cell.
Figure 12:
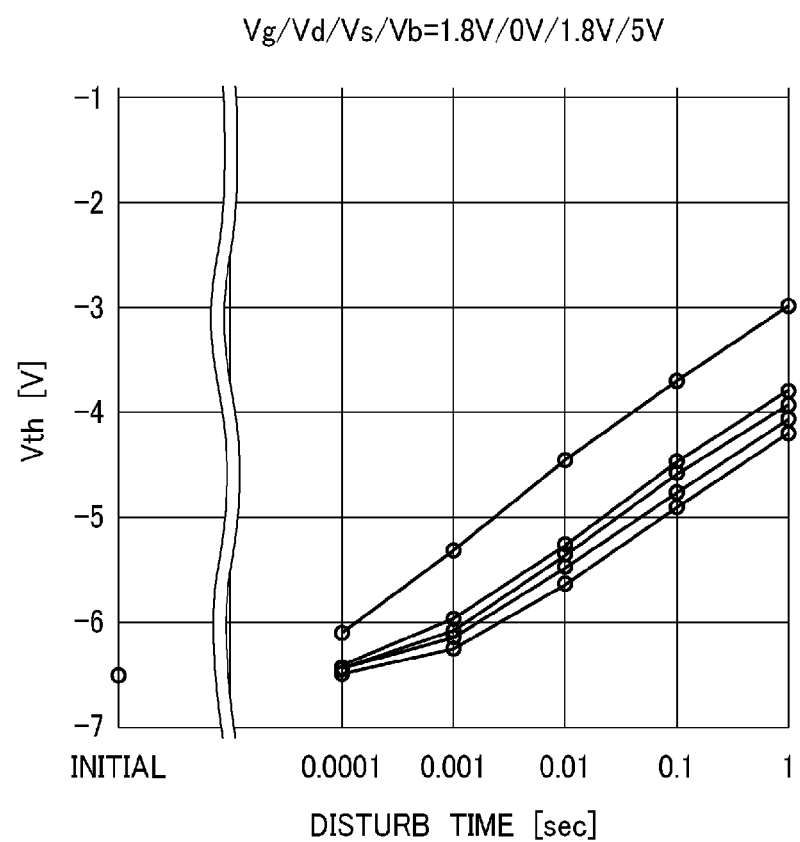
FIGS. 12, 13 and 17 are graphs illustrating the relationships between the threshold voltage of the memory transistor and the disturb period of time.
Figure 13:
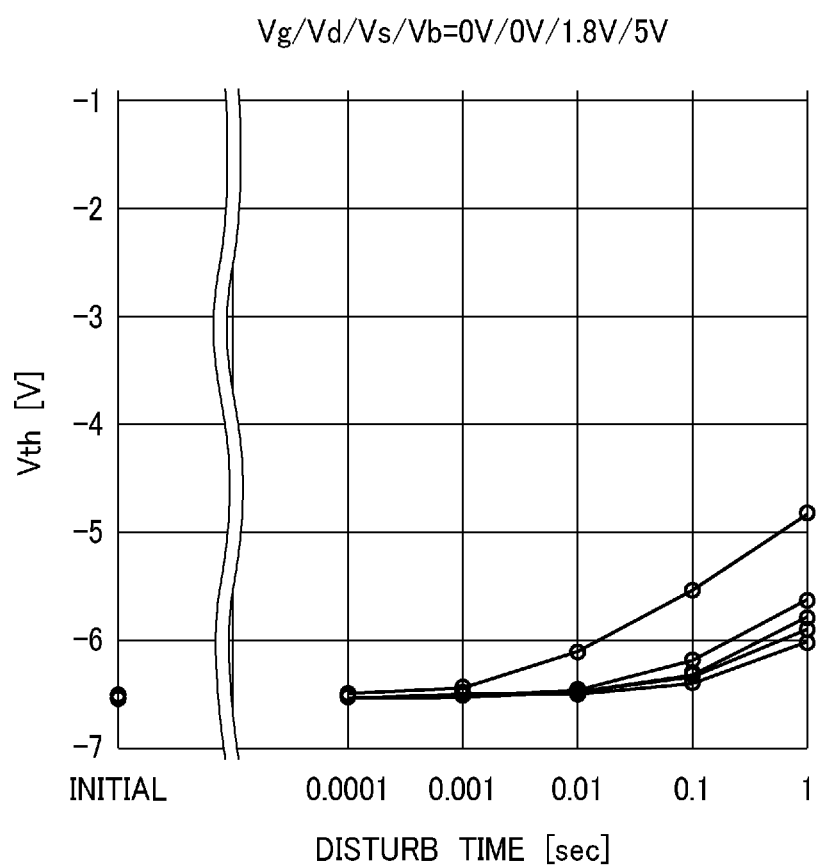
Figure 14:
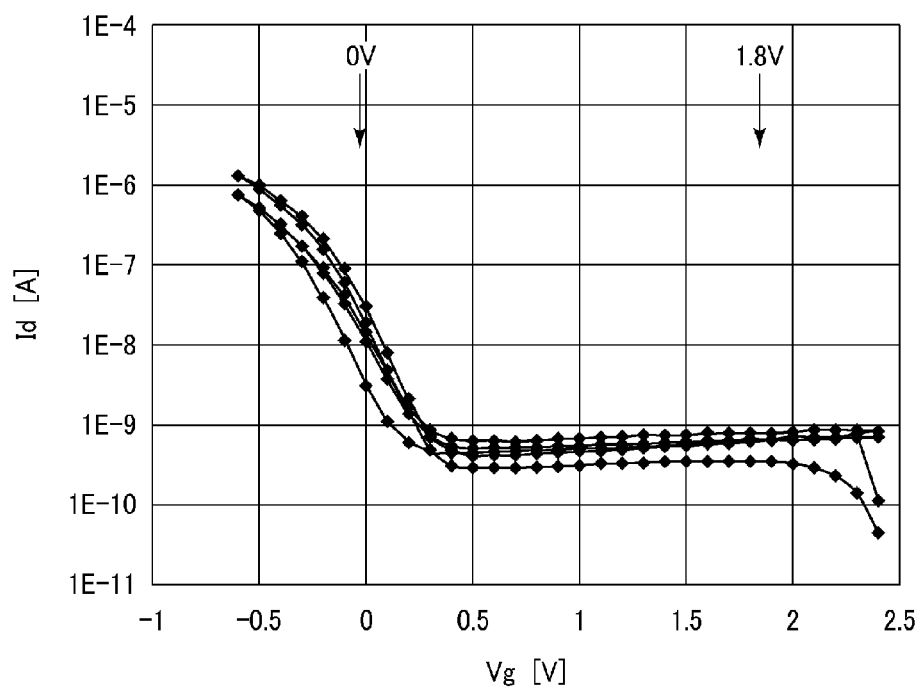
FIGS. 14 and 18 are graphs illustrating the relationships between the drain current and the control gate voltage, of the unselected memory cell.
Figure 15:
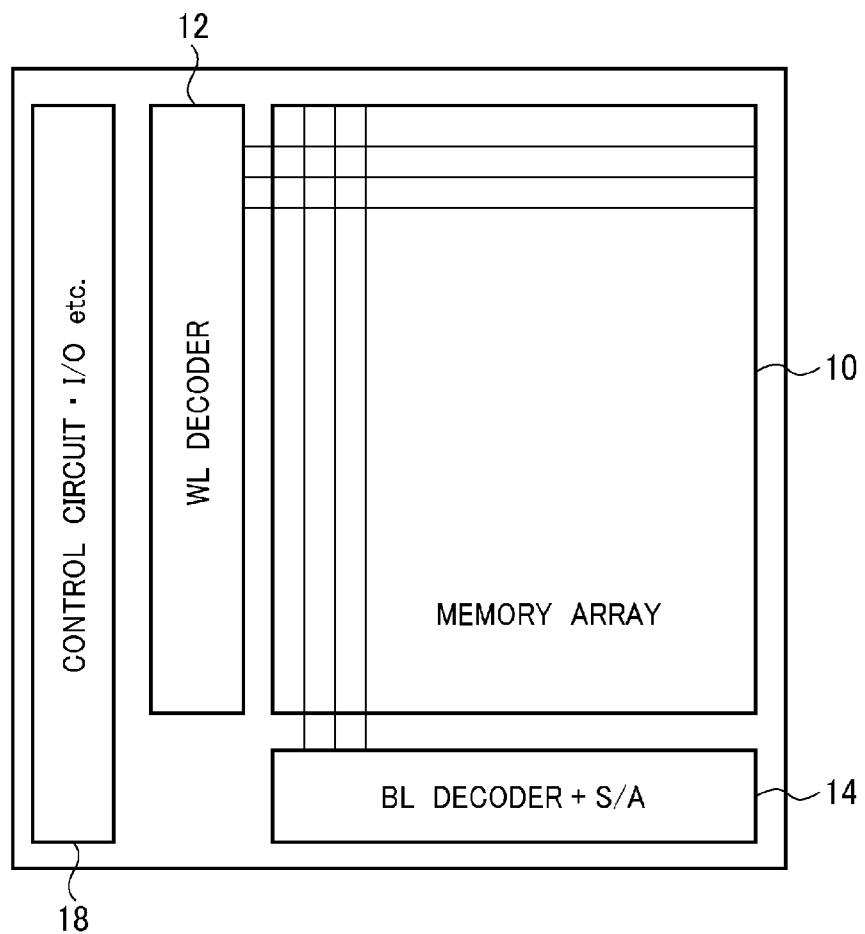
FIGS. 15 and 16 are plan views illustrating the layout of the semiconductor memory device according to a reference embodiment.
Figure 16:
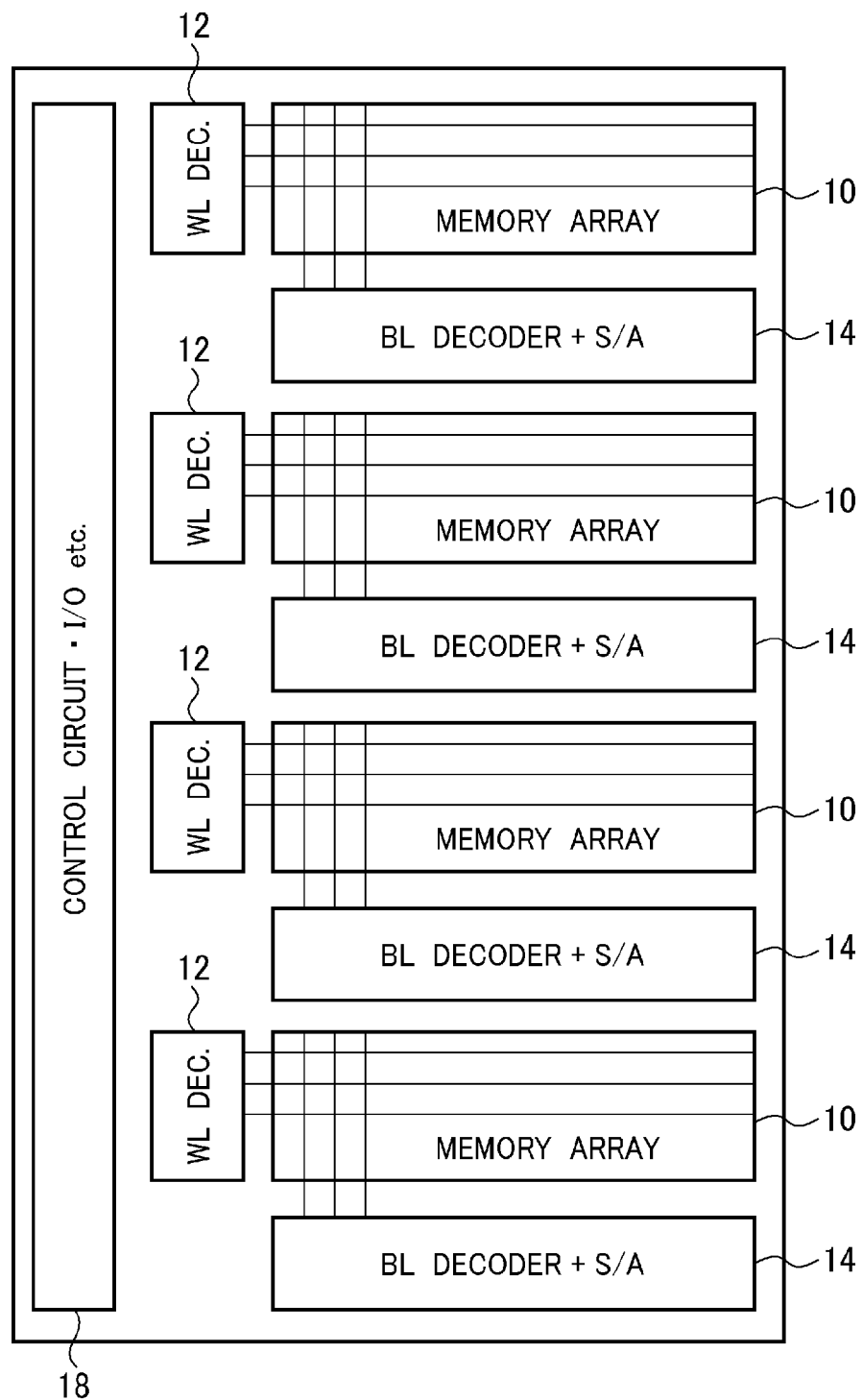
Figure 17:
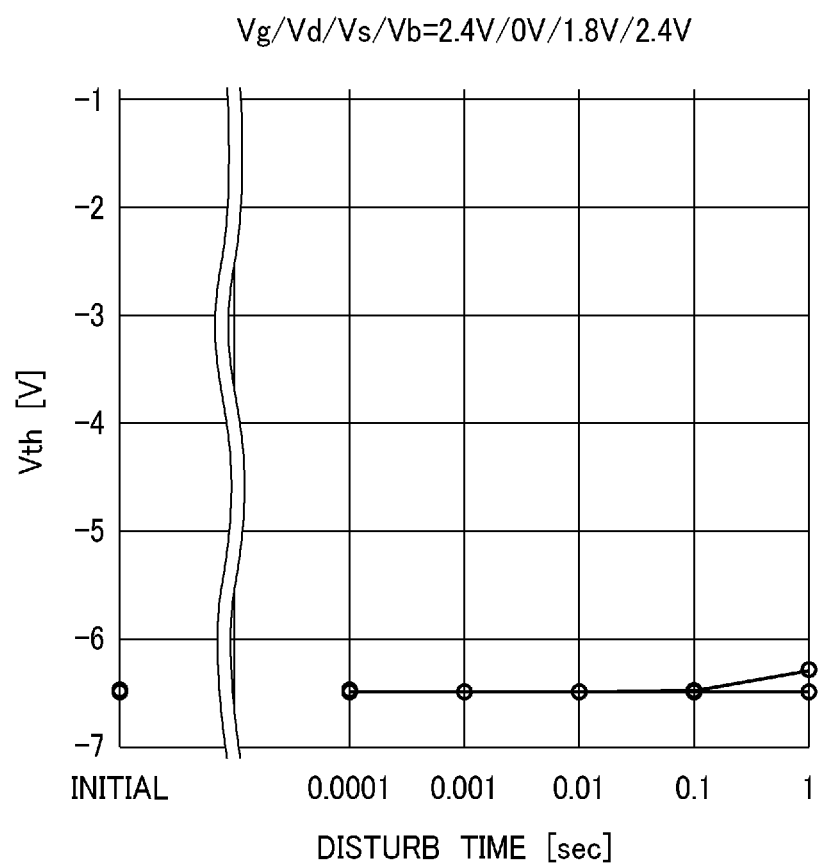
Figure 18:
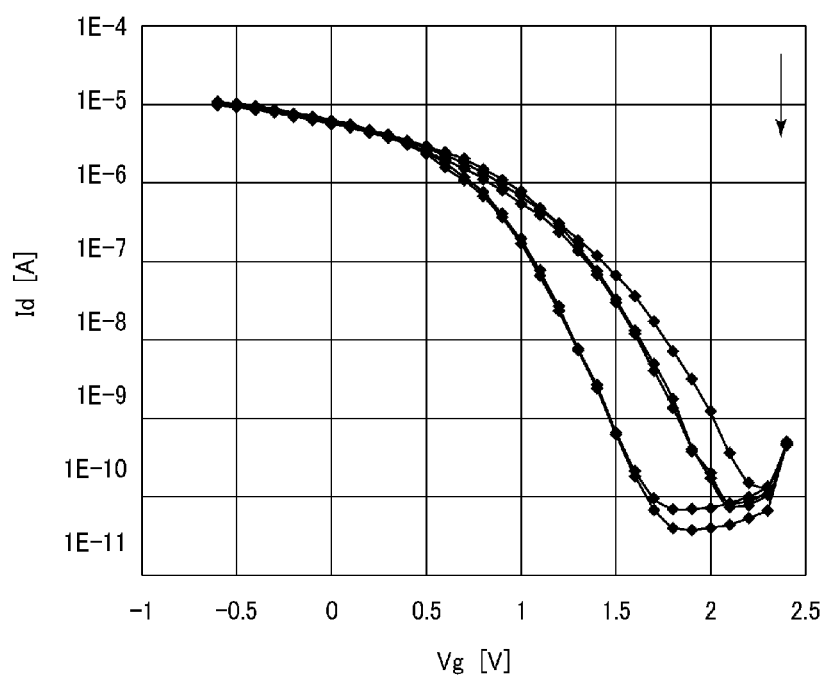
Figure 19A:
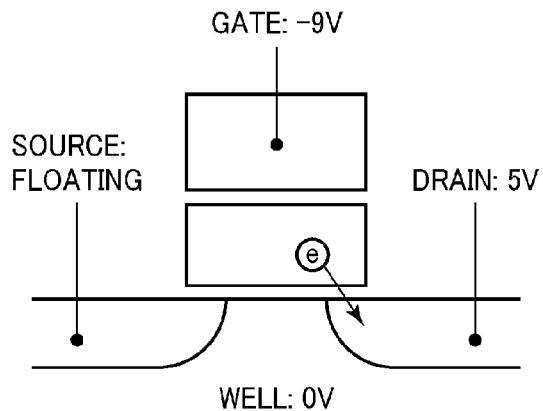
FIGS. 19A, 19B and 19C are views illustrating one example of the drive voltages of an n-channel flash memory transistor.
Figure 19B:
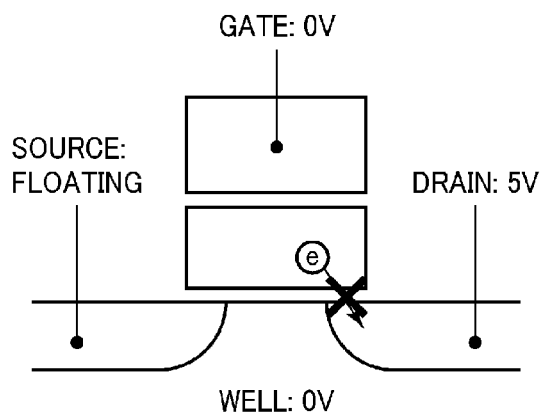
Figure 19C:
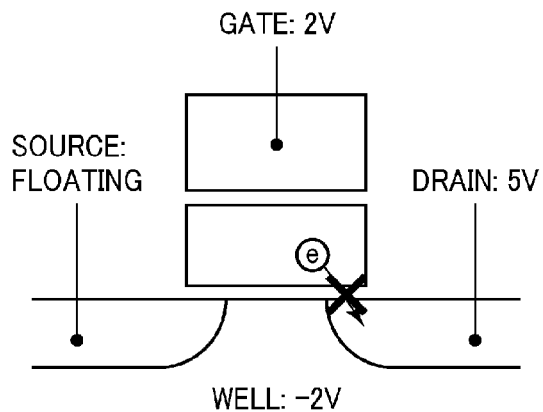

FIGS. 1, 2 and 3 are circuit diagrams illustrating a structure of a semiconductor memory device according to the present embodiment. FIG. 4 is a plan view illustrating the structure of the semiconductor memory device according to the present embodiment. FIGS. 5 and 6 are diagrammatic cross-sectional views illustrating the structure of the semiconductor memory device according to the present embodiment. FIG. 7 is a circuit diagram illustrating a method of programming the semiconductor memory device according to the present embodiment. FIGS. 8A, 8B and 8C are views illustrating voltages to be applied to a memory transistor in the method of programming the semiconductor memory device according to the present embodiment. FIGS. 9 and 10 are circuit diagrams illustrating a method of erasing the semiconductor memory device according to the present embodiment. FIG. 11 is a circuit diagram explaining the drain disturb of the unselected memory cell. FIGS. 12, 13 and 17 are graphs illustrating the relationships between the threshold voltage of the memory transistor and the disturb period of time. FIGS. 14 and 18 are graphs illustrating the relationships between the drain current and the control gate voltage, of the unselected memory cell. FIGS. 15 and 16 are plan views illustrating the layout of the semiconductor memory device according to a reference embodiment. FIGS. 19A, 19B and 19C are views illustrating one example of the drive voltages of an n-channel flash memory transistor.

First, the structure of the semiconductor memory device according to the present embodiment will be described with reference to FIGS. 1 to 6.

As illustrated in FIG. 1, the semiconductor memory device according to the present embodiment includes a memory array region 10, a plurality of word lines WL arranged row-wise in the memory array region 10, and a plurality of bit lines BL arranged column-wise in the memory array region 10. In the memory array region 10, a plurality of n-wells (Nwell_1-Nwell_4) are formed. The plurality of n-wells (Nwell_1-Nwell_4) are formed adjacent to each other column-wise and are electrically isolated from each other.

A word line select circuit 12 is connected to one ends of the plurality of word lines WL. The word line select circuit 12 decodes row address information and applies a prescribed voltage to a prescribed word line in programing, erasing and reading the memory cells formed in the memory array region 10.

A bit line select circuit/sense amplifier 14 is connected to one ends of the plurality of bit lines. The bit line select circuit/sense amplifier 14 decodes column address information and applies a prescribe voltage to a prescribed bit line in programming, erasing and reading the memory cells formed in the memory array region 10. The bit line select circuit/sense amplifier 14 includes a sense amplifier as a circuit for reading from the memory cells.

A well voltage control circuit 16 is connected to the plurality of n-wells (Nwell_1-Nwell_4). The well voltage control circuit 16 applies a prescribed voltage independently to each n-well (Nwell_1-Nwell_4).

A control circuit 18 is connected to the word line select circuit 12, the bit line select circuit/sense amplifier 14 and the well voltage control circuit 16. The control circuit 18 supplies a prescribed address information and a prescribed voltage to the word line select circuit 12, the bit line select circuit/sense amplifier 14 and the well voltage control circuit 16, based on a drive information for the memory array region 10. The control circuit 18 controls the word line select circuit 12, the bit line select circuit/sense amplifier and the well voltage control circuit 16 to thereby realize the program and erase operations to be described later.

In the memory array region 10, although not specifically defined, 512 word lines WL (WL0-WL511) and 1024 bit lines BL (BL0-BL1023), for example, are respectively arranged. The number of the n-wells will be described alter, but it is assumed here that 4 n-wells (Nwell_1, Nwell_2, Nwell_3 and Nwell_4), for example, are formed.

The plurality of word lines WL are divided in a plurality of sets corresponding to the number of the n-wells (Nwell_1, Nwell_2, Nwell_3 and Nwell_4). In the above-described example, where 512 word lines WL are arranged in the memory array region 10 containing 4 n-wells, as exemplified in FIG. 2, 128 word lines WL are arranged above each n-well. That is, the word lines WL0-WL127 are arranged above the n-well (Nwell_1). The word lines WL128-WL255 are arranged above the n-well (Nwell_2). The word lines WL256-WL383 are arranged above the n-well (Nwell_3). The word lines WL384-WL511 are arranged above the n-well (Nwell_4).

As exemplified in FIG. 3, memory cells MC formed of a p-channel flash memory transistor are provided at the respective intersections of the plurality of word lines WL and the plurality of bit lines BL. The word lines WL are connected to the control gates G of the p-channel flash memory transistors of the memory cells MC. The bit lines BL are connected to the drains D of the p-channel flash memory transistors of the memory cells MC. The sources S of the p-channel flash memory transistors of the memory cells MC are connected to the source line SL.

As described above, in the semiconductor memory device according to the present embodiment, the n-well in the memory array region 10 are divided column-wise in plural sections. The bit lines BL are arranged, longitudinally crossing the plurality of n-wells and are connected to the memory cells MC formed in the respective n-wells. That is, to one bit line BL, plural memory cells formed in different n-wells are serially connected.

FIGS. 4 to 6 are views illustrating one example of specific device structure for realizing the memory array region 10 of FIGS. 1 to 3. FIG. 4 is the enlarged plan view of a part enclosed by the dotted line in FIG. 2. FIG. 5 is the A-A' line cross-sectional view of FIG. 4. FIG. 6 is the B-B' line cross-sectional view of FIG. 4. In FIG. 4, the boundary region is the region between the memory array region and the peripheral circuit region and is provided for the purpose of ensuring the isolation between these regions, a processing margin, etc. The boundary region is provided, enclosing the entire periphery of the memory array region. The device structure for realizing the memory array region 10 of FIGS. 1 to 3 is not limited to the structure illustrated in FIGS. 4 to 6.

In a silicon substrate 20, n-wells 22 and a p-well 24 are provided. In FIG. 4, the upper n-well 22 corresponds to the Nwell_1 in FIG. 2, and the lower n-well 22 corresponds to the Nwell_2. The p-well 24 is provided between the n-well 22 (Nwell_1) and the n-well (Nwell_2).

A device isolation insulating film 26 defining active regions is formed in a silicon substrate 20. The device isolation insulating film 26 defines the action regions where the memory transistors are formed and defines an n-well taps 28 which are the regions of connections to the n-wells 22 and p-well taps 30 which are the regions of the connection to the p-well 24. Although not essential, the n-well taps 28 may be arranged e.g., at both extension-wise ends of the word lines WL in the n-wells 22. Although not essential, the p-well taps 30 may be arranged, e.g., respectively in the regions between the plurality of n-wells 22.

P-channel memory transistors each including a tunnel gate insulating film 32, a floating gate 34, an inter-gate insulating film 36 and a control gate 38 stacked on each other are formed in the active regions of the memory array region 10. The control gate 38 is formed, extended row-wise (transversely in FIG. 4), forming the word line WL commonly connecting the control gates 38 of the p-channel memory transistors arranged row-wise.

Two interconnection structures of the same structure as the word lines WL, which are provided adjacent to the word lines WL on both ends of each block are dummy word lines 40 provided for preventing size fluctuations of the word lines WL, etc. A dummy structure of the stacked structure, which is provided in the boundary region is formed incidentally in the step of forming the elements discriminately in the memory array region and in the peripheral circuit region.

An inter-layer insulating film 44 is formed above the silicon substrate 20 with the p-channel memory transistors formed on. The bit lines BL are formed above the inter-layer insulating film 44, extended column-wise (longitudinally in FIG. 4). The bit lines BL are connected to the drain terminals of the p-channel memory transistors arranged column-wise. Two interconnection structures of the same structure as the bit lines, which are provided adjacent to the bit lines BL at the ends of each block are dummy bit lines 46 provided for the prevention of size fluctuations of the bit lines BL, etc.

Next, the method of programming the semiconductor memory device according to the present embodiment will be described with reference to FIGS. 7 to FIG. 8C. The programming method will be explained below by means of the example where programming is made in the memory cell MC connected to the word line WL0 and the bit line BL0, but the explanation is the same with the case where programming is made in the other memory cells MC. In the specification of the present application, the operation of lowering the threshold voltage of the memory transistor by injecting electrons into the floating gate is defined as "programming".

In the program operation of the semiconductor memory device according to the present embodiment, the drive voltages exemplified in FIG. 7 are applied to the respective signal lines. That is, to the word line (selected word line: WL0) connected to the memory cell to be programmed (selected memory cell), 10 V, for example, is applied. To the word lines (unselected word lines: WL1-WL127) connected to the other memory cells (unselected memory cells) MC formed in the n-well the selected memory cell MC is formed in (selected n-well: Nwell_1), 0 V, for example, is applied. To the word lines (unselected word lines: WL128-WL511) connected to the unselected memory cells MC formed in the n-wells different from the selected n-well (unselected n-wells: Nwell_2-Nwell_4), 2.4 V, for example, is applied. To the bit line (selected bit line BL0) connected to the selected memory cell MC, 0 V, for example, is applied. To the bit lines different form the selected bit line BL0 (unselected bit lines BL1-BL1023), 2.4 V, for example, is applied. To the selected n-well (Nwell_1), 5 V, for example, is applied. To the unselected n-wells (Nwell_2-Nwell_4), 2.4 V, for example, is applied. To the source line SL, 1.8 V, for example, is applied.

The reason for applying such drive voltages to the respective signal lines will be described below. The values of the drive voltages are one example and can be changed suitably in the range where the effect to be described below can be realized.

In the p-channel flash memory transistors of the semiconductor memory according to the present embodiment, electrons generated by the so-called band-to-band tunneling (BTBT) are injected into the floating gate (charge storage layer) to thereby program. The prescribed programming voltages are applied to the drain, the control gate and the n-well so that electrons are generated by BTBT, are accelerated to be hot electrons and are injected into the floating gate of the selected memory cell MC.

It is difficult to independently decide the voltages to be applied to the respective terminals because the electric fields due to the voltages applied to the respective terminals influence each other, but the voltages to be applied to the respective terminals can be independently decided, based on the following idea. That is, the voltage to be applied between the drain and the control gate is so set that steep electric field is formed and the electrons are generated by BTBT. The voltage to be applied between the drain and the n-well is so set that the generated electrons are accelerated to be hot electrons. The voltage to be applied to the control gate and the n-well is so set that the generated hot electrons can be injected into the floating gate. To the source, a voltage higher than to the drain, e.g., a voltage higher by, e.g., power supply voltage than to the drain is applied.

Specifically, 5 V, for example, is applied to the drain, 10 V, for example, is applied to the control gate, 5 V, for example, is applied to the n-well, and 1.8 V, for example, is applied to the source. That is, to the selected bit line BL0, 0 V is applied, to the selected word line WL0, 10 V is applied, to the selected n-well (N well_1), 5 V is applied, and to the source line SL, 1.8 V is applied. Thus, programming can be made in the memory cell MC connected to the word line WL0 and the bit line BL0 (refer to FIG. 8A).

At this time, to the unselected word lines WL (WL1-WL127) connected to the unselected memory cells MC formed in the selected n-well (Nwell_1), a voltage lower than to the selected n-well (Nwell_1), for example, 0 V is applied. Thus, in the unselected memory cells MC in the selected n-well (Nwell_1) connected to the selected bit line BL0, the injection of the hot electrons into the floating gate by the electric field between the control gate and the n-well can be suppressed. Thus, the drain disturb in the unselected memory cells MC can be decreased (see FIG. 8B).

To the unselected n-wells (Nwell_2-Nwell_4), a voltage which makes the potential difference from the selected bit line BL0 becomes lower than the potential difference between the selected bit line BL0 and the selected n-well (Nwell_1). Preferably, a voltage which makes the potential difference between the selected bit line BL0 (drain) and the unselected n-wells (Nwell_2-Nwell_4) becomes not more than 3 V. For example, a voltage of 2.4 V is applied to the unselected n-wells (Nwell_2-Nwell_4). The energy barrier of silicon oxide the tunnel gate insulating films is generally formed of is about 3.2 eV. Setting the potential difference between the drain and the n-well at not more than about 3 V can effectively suppress the generation of hot electrons which tunnel the energy barrier of the tunnel gate insulating film. Thus, the drain disturb in the unselected memory cells MC can be suppressed (see FIG. 8C).

To the unselected word lines (WL128-WL511) connected to the unselected memory cells MC in the unselected n-wells (Nwell_2-Nwell_4), a voltage sufficient to turn off the memory transistors is applied. For example, to the unselected word lines WL (WL128-WL511), a voltage of 2.4 V, which is equal to the voltage applied to the unselected n-wells (Nwell_2-Nwell_4), is applied. Lowering the voltage of the unselected n-wells (Nwell_2-Nwell_4) weakens the back bias effect, and the transistors tend to turn on. However, the generation of hot electrons has been suppressed by lowering the voltage of the unselected n-wells (Nwell_2-Nwell_4), which allows the voltage to be applied to the control gate to be increased to turn off the transistor, and the leakage current can be decreased.

When the leakage current of the unselected memory cells MC in the unselected n-wells (Nwell_2-Nwell_4) is negligible, it is not necessary to change the application voltages between the unselected word lines (WL1-WL127) and the unselected word lines (WL 128-WL511). Cases that the leakage current is negligible include the case that the value of the leakage current itself is small, the case that the power consumption is negligible, and other cases.

To the unselected bit lines (BL1-BL1023), a voltage which makes the potential difference from the n-wells (Nwell_1-Nwell_4) smaller than the potential difference between the selected bit line BL0 and the selected n-well (Nwell_1) is applied. Preferably, a voltage which makes the potential difference between the unselected bit line (BL1-BL1023) and the n-wells (Nwell_1-Nwell_4) not more than about 3 V. For example, a voltage of 2.4 V, which is equal to the voltage applied to the unselected n-wells (Nwell_2-Nwell_4), is applied. Thus, the generation of hot electrons due to the electric field of the n-well can be suppressed, and the drain disturb in the unselected memory cells can be suppressed.

Thus, a programming can be made in a selected memory cell while the drain disturb and the leakage current in the unselected memory cells are being suppressed.

In the above description, a programming is made in 1 memory cell connected to the selected word line WL, but it is possible that a plurality of the bit lines are simultaneously selected, and the programming may be simultaneously made in a plurality of the memory cells MC connected to 1 selected word line WL.

Next, the method of erasing the semiconductor memory device according to the present embodiment will be described with reference to FIGS. 9 and 10. In the specification of the present application, the operation of increasing the threshold voltage of the memory transistor by extracting electrons from the floating gate is defined as "erasing".

In the erase operation of the semiconductor memory device according to the present embodiment, the erasing is made at once in the same sector. As exemplified in FIG. 9, with −10 V being applied to the word lines WL0-WL511 and the source line SL and the n-wells (Nwell_1-Nwell_4) and the bit lines BL0-BL1023 being made open, electrons are extracted from the floating gates. Otherwise, as exemplified in FIG. 10, with −10 V being applied to the word lines WL0-WL511 and the bit lines BL0-BL1023 and the n-wells (Nwell_1-Nwell_4) and the source line SL being made open, electrons are extracted from the floating gates.

Thus, information stored in all the memory cells MC in the memory array region 10 can be erased.

Next, the advantageous effect of the method of programming the semiconductor memory device according to the present embodiment will be detailed with reference to FIG. 11 to FIG. 19C.

It is assumed that in the circuit illustrated in FIG. 11, programming is made in a memory cell connected to a word line WL0 and a bit line BL0 and enclosed by the circular dotted line. 0 V is applied to the selected bit line BL0, 2.4 V is applied to the unselected bit line BL1, 10 V is applied to the selected word line WL0, 1.8 V is applied to the unselected word line WL1, 1.8 V is applied to the source line SL and 5 V is applied to the n-well. The memory cell is a P-channel flash memory transistor.

At this time, to the drain of the unselected memory cell connected to the unselected word line WL1 and the selected bit line BL0 and enclosed by the square dotted line, a voltage equal to that of the drain of the selected memory cell is applied. A voltage lower than that of the selected word line WL0 is applied to the unselected word line WL1, but the programming a little advances into this unselected memory cell. That is, the so-called drain disturb takes place.

FIG. 12 is the graph of the result of measuring the threshold voltage variations of the memory transistor of the unselected memory cell due to the drain disturb upon an application of the drive voltage under the conditions of FIG. 11. The threshold voltage of the memory transistor is taken on the vertical axis, and on the horizontal axis, the application period of time (disturb time) of the voltage to the drain is taken.

As illustrated in FIG. 12, as the disturb time increases, the absolute value of the threshold voltage decreases. In the example of FIG. 12, when the disturb time is not less than about 1 msec, the threshold voltage of the memory transistor varies. When the period of time of programming in 1 memory cell is assumed about 10 µsec-20 µsec, in order to suppress the variation of the threshold voltage with the disturb period of time being not more than 1 msec, the number of the memory cells connected to 1 bit line BL must be about 50 cells-100 cells.

FIG. 13 is the graph of the result of measuring the threshold voltage variations of the memory transistor of the unselected memory cell due to the drain disturb when the application voltage to the unselected word line WL1 is lowered to 0 V.

As illustrated in FIG. 13, the application voltage to the unselected word line WL1 is lowered, whereby the drain disturb can be suppressed in comparison with the case of FIG. 12. However, lowering the application voltage to the unselected word line WL1 causes another new problem.

FIG. 14 is the graph of the result of measuring the relationships between the drain current and the gate voltage of the memory transistor of the unselected memory cell.

As illustrated in FIG. 14, the drain current given when the gate voltage of the unselected memory cell is 1.8 V is less than 1 nA, but when the gate voltage is lowered to 0 V, the drain current increases by 1 placement or more. The drain current flowing in the unselected memory cell is, in a sense, the leakage current and is a cause for the power consumption increase. As more memory cells are connected to 1 bit line BL, the total leakage current increase the more.

As described above, it is not preferable to lower the voltage to be applied to the unselected word line WL1 as means of suppressing the influence of the drain disturb, in view of the power consumption.

In the flash memory, for the speedy operation, it is preferable to arrange the sense amplifier immediately near the bit lines BL. This is because arranging the sense amplifier remote from the bit lines BL cause delays in the interconnections, which makes the operation slow. Accordingly, in the general layout, as exemplified in FIG. 15, the bit line select circuit/sense amplifier 14 is arranged adjacent to the memory array region 10. The semiconductor memory device using memory cells which are strong to the drain disturb, e.g., n-channel flash memory transistors can use the layout as illustrated in FIG. 15.

On the other hand, in the semiconductor memory device using memory cells which are restricted by the drain disturb, e.g., p-channel flash memory transistors, a number of the memory cells connected to 1 bit line must be made small as described above, and the bit line BL are shortened. Resultantly, as exemplified in FIG. 16, the memory array region 10 is divided in plural sections, and the bit line select circuit/sense amplifier 14 must be provided for each memory array region.

The sense amplifier is a relatively complicated circuit and takes a large area in a chip. Accordingly, providing the bit line select circuit/sense amplifier 14 in each divided memory array region 10 leads to increasing the chip area.

In the semiconductor memory device according to the present embodiment, however, the number of the memory cells connected to 1 bit line is not decreased, but the n-well is divided in the direction of extension of the bit lines BL. Thus, in comparison with the layout of FIG. 15, the chip area can be drastically diminished.

By dividing the n-well in plural sections, of the memory cells MC connected to a selected bit line BL, the number of unselected memory cells formed in a selected n-well can be made small. Thus, even when the drain disturb is suppressed by lowering the application voltage to the control gates, the total leakage current can be decreased. Preferably, a number of the divided n-wells is suitably set corresponding to a value of the allowable leakage current, based on a number of the memory cells MC and a number of the entire word lines for realizing the allowable leakage current.

In the semiconductor memory device according to the present embodiment, the voltage of the selected n-well (e.g., Nwell_1) and the voltage of the unselected n-wells (e.g., Nwell_2-Nwell_4) can be independently controlled. This allows voltage conditions for less drain disturb to be used for the unselected memory cells formed in the unselected n-wells independent from the memory cells formed in the selected n-well.

FIG. 17 is the graph of the result of measuring the threshold voltage variations due to the drain disturb, of the memory transistor of the unselected memory cell formed in the unselected n-well. The threshold voltage of the memory transistor is taken on the vertical axis, and on the horizontal axis, the application period of time of voltage (disturb time) to the drain is taken.

As illustrated in FIG. 17, the drain disturb of the unselected memory cell formed in the unselected n-well can be drastically suppressed in comparison with the drain disturb of the unselected memory cells formed in the selected n-well (refer to FIG. 12).

FIG. 18 is the graph of the result of measuring the relationship between the drain current and the control gate voltage, of the memory transistor of the unselected memory cell formed in the unselected n-well.

As illustrated in FIG. 18, the leakage current could be decreased to not more than 1 nA by setting the voltages applied to the word lines WL and the N well at 2.4 V.

When a p-well is divided in the same way as in the semiconductor memory device according to the present embodiment in a semiconductor memory device using n-channel flash memory transistors, the application voltages as exemplified in FIGS. 19A-19C are assumed. FIG. 19A illustrates one example of the application voltages to the selected memory cell. FIG. 19B illustrates the application voltages to the unselected memory cell connected to the selected bit line in the selected p-well. FIG. 19C illustrates the application voltages to the unselected memory cell connected to the selected bit line in the unselected p-well.

In the selected memory cell, as illustrated in FIG. 19A, programming is made extracting electrons from the floating gate by, e.g., applying −9 V to the control gate, applying 5 V to the drain, applying 0 V to the p-well and floating the source.

In the unselected memory cell in the selected p-well, as illustrated in FIG. 19B, programming is prevented by lowering the voltage to be applied to the control gate to mitigate the electric field between the floating gate and the drain.

In the unselected memory cell formed in the unselected p-well, as illustrated in FIG. 19C, a voltage in the direction of further decreasing the potential difference between the drain and the control gate is applied to further lower the drain disturb. In this state, the transistor turns on, and leakage current is generated. For this, the countermeasure of applying the voltage on the negative voltage side by the p-well to raise the threshold voltage is made. However, to the control gate, the voltage must be applied in the direction turning on the transistor, which makes the countermeasure unable to basically prevent the leakage current.

In the semiconductor memory device according to the present embodiment, in the unselected memory cell formed in the unselected n-well, the voltage to be applied to the control gate is increased in the direction enlarging the potential difference between the drain and the control gate. The voltage to be applied to the n-well is decreased in the direction of diminishing the voltage difference between the drain and the n-well. Such voltage setting is opposite to that of the above-described n-channel flash memory transistor.

The differences between the semiconductor memory device according to the present embodiment and the semiconductor memory device using the n-channel flash memory transistors are as follows.

In the semiconductor memory device according to the present embodiment, the generation of hot electrons is suppressed to thereby decrease the disturb. In the semiconductor memory device using the n-channel flash memory transistors, however, the disturb is decreased by decreasing the Fowler-Nordheim (FN) tunneling current.

In the semiconductor memory device according to the present embodiment, the voltages to be applied to the unselected n-wells are shifted in the direction of shallowing the threshold voltage of the memory cell transistors in comparison with the voltage to be applied to the selected n-well. In contrast to this, in the semiconductor memory device using the n-channel flash memory transistors, the voltages to be applied to the unselected p-wells are shifted in the direction deepening the threshold voltage of the memory transistor in comparison with the voltage to be applied to the selected p-well.

In the semiconductor memory device according to the present embodiment, the voltage to be applied to the unselected word lines in the unselected n-well is shifted in the direction enlarging the potential difference between the drain and the control gate in comparison with the voltage to be applied to the unselected word lines in the selected n-well. In contrast to this, in the semiconductor memory device using the n-channel flash memory transistors, the voltages to be applied to the unselected word lines in the unselected p-wells are shifted in the direction of reducing the potential difference between the drain and the control gate in comparison with the voltage to be applied to the unselected word lines in the selected p-well.

In the semiconductor memory according to the present embodiment, as the main countermeasure to the drain disturb, the potential of the n-well is lowered. In contrast to this, in the semiconductor memory device using n-channel flash memory transistors, as the main countermeasure to the drain disturb, the potential difference between the control gate and the drain is reduced.

In the semiconductor memory device according to the present embodiment, as the main countermeasure to the leakage current, the voltage to be applied to the control gate is lowered to turn off the memory transistor. In contrast to this, in the semiconductor memory device using the n-channel flash memory transistors, the threshold voltage is shifted in the lowering direction by the applied voltage of the p-well.

As described above, the n-channel flash memory transistor has the various differences due to the programming mechanism different from that of the p-channel flash memory transistor. In the n-channel flash memory transistor, it is difficult to counter both the drain disturb and the leakage current by the same method of the semiconductor memory device according to the present embodiment.

As described above, according to the present embodiment, in the semiconductor memory device using p-channel flash memory transistors, the influence of the drain disturb can be suppressed. Thus, the reliability of the semiconductor memory device can be improved. The leakage current upon programming can be decreased, and the power consumption of the semiconductor memory device can be lowered.

[Modified Embodiments]

The above-described embodiments can cover other various modifications.

For example, in the above-described embodiment, the semiconductor memory device using the p-channel flash memory transistor having stacked gate structure is exemplified, but the memory transistor is not essentially of the stacked gate structure. The semiconductor memory devices using, as the memory transistors, flash memory transistor including the insulating film of, e.g., ONO film as the charge storage layer, such as, e.g., p-channel flash memory transistors of MONOS type can be applied.

The structure, the constituent materials, values of the drive voltage, etc. of the semiconductor memory device described in the above embodiment are merely examples and can be modified or changed suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor memory device comprising:
   a semiconductor substrate that includes a first memory array region;
   a first n-well formed in the first memory array region of the semiconductor substrate;
   a second n-well, that is adjacent to the first n-well, formed in the first memory array region of the semiconductor substrate and electrically isolated from the first n-well;
   a first p-channel memory transistor, that includes a first drain, formed in the first n-well;
   a second p-channel memory transistor, that includes a second drain, formed in the second n- well;
   a first bit line select circuit;
   a first word line connected to a control gate of the first p-channel memory transistor;
   a second word line connected to a control gate of the second p-channel memory transistor;
   a first bit line, that is connected to the first bit line select circuit, connected to the first drain and the second drain; and
   a control circuit that, upon programming in the first p-channel memory transistor, applies a first voltage to the first bit line, a second voltage to the first n-well and a third voltage lower than the second voltage to the second n-well.

2. The semiconductor memory device according to claim 1, wherein
   a potential difference between the first voltage and the third voltage is not more than 3 V.

3. The semiconductor memory device according to claim 1, further comprising:
   a third p-channel memory transistor, that includes a third drain connected to the first bit line, formed in the first n-well; and
   a third word line connected to a control gate of the third p-channel memory transistor,
   wherein the control circuit applies, upon programming in the first p-channel memory transistor, a fourth voltage lower than the second voltage to the third word line.

4. The semiconductor memory device according to claim 1, wherein
   the control circuit applies, upon programming in the first p-channel memory transistor, a fifth voltage that turns off the second p-channel memory transistor to the second word line.

5. The semiconductor memory device according to claim 1, further comprising:
   a fourth p-channel memory transistor, that includes a control gate connected to the first word line and that includes a fourth drain, formed in the first n-well; and
   a second bit line connected to the fourth drain,
   wherein the control circuit applies, upon programming in the first p-channel memory transistor, a sixth voltage higher than the first voltage to the second bit line.

6. The semiconductor memory device according to claim 5, wherein
   a potential difference between the second voltage and the sixth voltage is not more than 3 V.

7. The semiconductor memory device according to claim 1, wherein
   the control device, upon programming in the first p-channel memory transistor, applies a seventh voltage to the first word line, generates electrons by band-to-band tunneling caused by an application of the first voltage and the seventh voltage and accelerates the electrons by a potential difference between the first voltage and the second voltage to inject the electrons into a charge storage layer of the first p-channel memory transistor.

8. A method of driving a semiconductor memory device that includes a first n-well formed in a first memory region of a semiconductor substrate, a second n-well formed in the first memory region of the semiconductor substrate and electrically isolated from the first n-well and located adjacent to the first n-well, a first bit line select circuit, a first p-channel memory transistor formed in the first n-well, a second p-channel memory transistor formed in the second n-well, a first word line connected to a control gate of the first p-channel memory transistor, a second word line connected to a control gate of the second p-channel memory transistor, and a first bit line connected to the first bit line select circuit and connected to a first drain of the first p-channel transistor and a second drain of the second p-channel memory transistor, comprising:
   upon programming the first p-channel memory transistor, a first voltage being applied to the first bit line, a second voltage being applied to the first n-well, and a third voltage lower than the second voltage being applied to the second n-well.

9. The method of driving a semiconductor memory device according to claim 8, wherein
   a potential difference between the first voltage and the third voltage is not more than 3 V.

10. The method of driving a semiconductor memory device according to claim 8, wherein
    the semiconductor memory device further includes
       a third p-channel memory transistor, that includes a third drain connected to the first bit line, formed in the first n-well, and
       a third word line connected to a control gate of the third p-channel memory transistor, upon programming in the first p-channel memory transistor, a fourth voltage lower than the second voltage is applied to the third word line.

11. The method of driving a semiconductor memory device according to claim 8, wherein
upon programming in the first p-channel memory transistor, a fifth voltage that turns off the second p-channel memory transistor is applied to the second word line.

12. The method of driving a semiconductor memory device according to claim 8, wherein
the semiconductor memory device further includes
a fourth p-channel memory transistor, that includes a control gate connected to the first word line and that includes a fourth drain, formed in the first n-well, and a second bit line connected to the fourth drain,
upon programming in the first p-channel memory transistor, a sixth voltage higher than the first voltage is applied to the second bit line.

13. The method of driving a semiconductor memory device according to claim 12, wherein
a potential difference between the second voltage and the sixth voltage is not more than 3 V.

14. The method of driving a semiconductor memory device according to claim 8, wherein
upon programming in the first p-channel memory transistor, a seventh voltage is applied to the first word line to generate electrons by the band-to-band tunneling caused by an application of the first voltage and the seventh voltage, and the electrons are accelerated by a potential difference between the first voltage and second voltage to be injected into the charge storage layer of the first p-channel memory transistor.

15. The method of driving a semiconductor memory device according to claim 8, wherein
erasing of the first p-channel memory transistor and the second p-channel memory transistor are made simultaneously.

* * * * *